US010488886B2

United States Patent
Browne et al.

(10) Patent No.: US 10,488,886 B2
(45) Date of Patent: Nov. 26, 2019

(54) FLEXIBLE DISPLAY SYSTEMS AND METHODS FOR CONTROLLING AND OPERATING THE SAME

(71) Applicant: Lenovo Enterprise Solutions (Singapore) Pte. Ltd., New Tech Park (SG)

(72) Inventors: Jason Allen Browne, Apex, NC (US); Jeffrey Ross Hamilton, Pittsboro, NC (US); Ross Lee Mickens, Cedar Grove, NC (US); Mike Yubo Zhu, Apex, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 270 days.

(21) Appl. No.: 14/992,497

(22) Filed: Jan. 11, 2016

(65) Prior Publication Data

US 2017/0200545 A1 Jul. 13, 2017

(51) Int. Cl.
 *G06F 1/16* (2006.01)
 *H01L 51/52* (2006.01)
 *H01F 7/06* (2006.01)

(52) U.S. Cl.
 CPC ............. *G06F 1/1652* (2013.01); *H01F 7/06* (2013.01); *H01L 51/52* (2013.01); *H01L 2251/5338* (2013.01)

(58) Field of Classification Search
 CPC ..... G06F 1/1652; G06F 3/0488–04886; G06F 1/162; G09F 15/00; H01F 7/064; H01F 7/06; H05K 7/005; H01L 51/52
 See application file for complete search history.

(56) References Cited

U.S. PATENT DOCUMENTS

| 8,289,232 B2* | 10/2012 | Kobayashi | G09F 9/33 |
| | | | 345/204 |
| 9,123,290 B1* | 9/2015 | Cho | G06F 1/1652 |
| 9,756,744 B2* | 9/2017 | Bostick | H05K 5/0217 |
| 2008/0086925 A1* | 4/2008 | Yang | H04M 1/0268 |
| | | | 40/610 |

(Continued)

FOREIGN PATENT DOCUMENTS

JP 2015194752 * 9/2015

OTHER PUBLICATIONS

Miller, David W. "High-Temperature Superconductors As Electromagnetic Deployment and Support Structures in Spacecraft." NASA, Oct. 1, 2012. Web. Jan. 8, 2016. <http://www.nasa.gov/pdf/716071main_Miller_2011_Phl_Electromagnetic_Deployment.pdf>.

Das, Sumi. "A Keyboard That Rises up from Flat Touch Screens." CNET, Feb. 13, 2013. Web. Jan. 8, 2016. <http://www.cnet.com/news/a-keyboard-that-rises-up-from-flat-touch-screens/>.

(Continued)

*Primary Examiner* — Ronald W Leja
*Assistant Examiner* — Christopher J Clark
(74) *Attorney, Agent, or Firm* — Olive Law Group, PLLC (57) ABSTRACT

Flexible display systems and methods for controlling and operating the same are disclosed herein. According to an aspect, a display system is provided. The display system comprises a display that is configured to be shaped in one of a first shape and a second shape, the first shape and the second shape being different shapes. The display system further comprises electromagnets attached to the display and oriented such that when the electromagnets are actuated, the display is held in the first shape.

12 Claims, 6 Drawing Sheets

(56) References Cited

U.S. PATENT DOCUMENTS

| | | | | |
|---|---|---|---|---|
| 2014/0321073 | A1* | 10/2014 | Hong | G06F 1/1652 361/749 |
| 2015/0116921 | A1* | 4/2015 | Hsu | G06F 1/1618 361/679.27 |
| 2015/0146387 | A1* | 5/2015 | Lee | G06F 1/1652 361/749 |
| 2015/0267572 | A1* | 9/2015 | Pasqualetto | F01L 13/0015 123/90.17 |
| 2017/0068318 | A1* | 3/2017 | McClure | G06F 3/016 |
| 2017/0092224 | A1* | 3/2017 | Senda | G06F 1/1686 |
| 2017/0109114 | A1* | 4/2017 | Wang | G06F 3/147 |
| 2017/0181304 | A1* | 6/2017 | Lee | H05K 7/005 |
| 2017/0278436 | A1* | 9/2017 | Chu | G09F 9/301 |

OTHER PUBLICATIONS

Subramanian, Sushma. "The Future of Tactile Touch Screens." Discover Magazine, Aug. 25, 2015. Web. Jan. 8, 2016. <http://discovermagazine.com/2015/june/17-hooked-on-a-feeling>.

Orf, Darren. "Tactile Keyboards That Rise Out of Touchscreens Are Finally Here." Gizmodo. Gizmodo, Feb. 12, 2015. Web. Jan. 8, 2016. <http://gizmodo.com/keyboards-that-rise-out-of-a-touchscreen-are-finally-he-1685246880>.

Chauhan, Sonam. "Ferrofluid Touch Interface." Halfbakery, May 19, 2007. Web. Jan. 8, 2016. <http://www.halfbakery.com/idea/Ferrofluid_20touch_20interface>.

Brehm, Denise. "Device Turns Computer into Tactile Tool, Lets User Touch Virtual Objects." MIT News. Massachusetts Institute of Technology, Mar. 11, 1998. Web. Jan. 8, 2016. <http://news.mit.edu/1998/phantom>.

\* cited by examiner

FLEXIBLE DISPLAY SYSTEMS AND METHODS FOR CONTROLLING AND OPERATING THE SAME

TECHNICAL FIELD

The present subject matter relates to display systems. More specifically, the present subject matter relates to flexible display systems and methods for controlling and operating the same.

BACKGROUND

Cathode ray tube (CRT) displays and liquid crystal displays (LCDs) are, in nature, traditional rigid display screens, and are widely used in smart phones, tablet computers, e-readers, displays, and the like.

With the advent of time, display systems have evolved, from a traditional single rigid display screen to a hinged dual display system and then to a flexible display system. A flexible display screen, also known as flexible display or curved display, is a bendable/deformable display device that includes a flexible, visible panel made of a flexible material. Currently available flexible display techniques mainly include organic LED (OLED) techniques, e-paper technique, and the like.

Generally, a conventional flexible display screen has a particular curvature, which is preset during its manufacture. The flexible display screen is deformable/bendable in only one pre-designed fixed shape/curvature. Therefore, it can become a problem when the consumer desires to adjust the curvature or shape of a display screen.

SUMMARY

Disclosed herein are flexible display systems and methods for controlling and operating the same. According to an aspect, a display system is provided. The display system comprises a display that is configured to be shaped in one of a first shape and a second shape, the first shape and the second shape being different shapes. The display system further comprises electromagnets attached to the display and oriented such that when the electromagnets are actuated, the display is held in the first shape.

According to another aspect of the present subject matter, a method is provided that provides a display system. The display system comprises a display configured to be shaped in one of a first shape and a second shape, the first shape and the second shape being different shapes, and electromagnets attached to the display and oriented such that when the electromagnets are actuated, the display is held in the first shape. The method further includes controlling actuation of the electromagnets.

BRIEF DESCRIPTION OF THE DRAWINGS

The illustrated embodiments of the disclosed subject matter will be best understood by reference to the drawings, wherein like parts are designated by like numerals throughout. The following description is intended only by way of example, and simply illustrates certain selected embodiments of devices, systems, and processes that are consistent with the disclosed subject matter as claimed herein.

DETAILED DESCRIPTION

The following detailed description is made with reference to the figures. Exemplary embodiments are described to illustrate the disclosure, not to limit its scope, which is defined by the claims. Those of ordinary skill in the art will recognize a number of equivalent variations in the description that follows.

As referred to herein, the term "computing device" should be broadly construed. It can include any type of device including hardware, software, firmware, the like, and combinations thereof. A computing device may include one or more processors and memory or other suitable non-transitory, computer readable storage medium having computer readable program code for implementing methods in accordance with embodiments of the present disclosure. A computing device may be a mobile computing device such as, for example, but not limited to, a smart phone, a cell phone, a pager, a personal digital assistant (PDA), a mobile computer with a smart phone client, or the like. A computing device can also include any type of conventional computer, for example, a laptop computer or a tablet computer. A typical mobile computing device is a wireless data access-enabled device (e.g., an iPhone smart phone, a BLACKBERRY® smart phone, a NEXUS ONE™ smart phone, an iPad® device, or the like) that is capable of sending and receiving data in a wireless manner using protocols like the Internet Protocol, or IP, and the wireless application protocol, or WAP. This allows users to access information via wireless devices, such as smart phones, mobile phones, pagers, two-way radios, communicators, and the like. Wireless data access is supported by many wireless networks, including, but not limited to, CDPD, CDMA, GSM, PDC, PHS, TDMA, FLEX, Reflex, iDEN, TETRA, DECT, DataTAC, Mobitex, EDGE and other 2G, 3G, 4G and LTE technologies, and it operates with many handheld device operating systems, such as PalmOS, EPOC, Windows CE, FLEXOS, OS/9, JavaOS, iOS and Android. Typically, these devices use graphical displays and can access the Internet (or other communications network) on so-called mini- or micro-browsers, which are web browsers with small file sizes that can accommodate the reduced memory constraints of wireless networks. In a representative embodiment, the mobile device is a cellular telephone or smart phone that operates over GPRS (General Packet Radio Services), which is a data technology for GSM networks. In addition to a conventional voice communication, a given mobile device can communicate with another such device via many different types of message transfer techniques, including SMS (short message service), enhanced SMS (EMS), multi-media message (LMS), email WAP, paging, or other known or later-developed wireless data formats. Although many of the examples provided herein are implemented on smart phone, the examples may similarly be implemented on any suitable computing device, such as a computer.

As referred to herein, the term "user interface" is generally a system by which users interact with a computing device. A user interface can include an input for allowing users to manipulate a computing device, and can include an output for allowing the computing device to present information and/or data, indicate the effects of the user's manipulation, etc. An example of a user interface on a computing device includes a graphical user interface (GUI) that allows users to interact with programs or applications in more ways than typing. A GUI typically can offer display objects, and visual indicators, as opposed to text-based interfaces, typed command labels or text navigation to represent information and actions available to a user. For example, a user interface can be a display window or display object, which is selectable by a user of a computing device for interaction. In another example, the user can use any other suitable user interface of a computing device, such as a keypad, to select the display icon or display object. For example, the user can use a track ball or arrow keys for moving a cursor to highlight and select the display object.

As used herein, the term "memory" is generally a storage device of a computing device. Examples include, but are not limited to, ROM and RAM.

As used herein, the term "display" is generally a display device used for presenting information in visual or tactile form. For example, a display may be a flexible display. Examples include, but are not limited to, an electronic paper based display, and a flexible organic light emitting diode (OLED) display.

As used herein, the term "electromagnet" is a type of magnet in which the magnetic field is produced by an electric current. The magnetic field disappears when the current is turned off. Electromagnets usually consist of a large number of closely spaced turns of wire that create the magnetic field. The wire turns are often wound around a magnetic core made from a ferromagnetic material such as iron. The magnetic core concentrates the magnetic flux and makes a more powerful magnet.

The device or system for performing one or more operations on a memory of a computing device may be a software, hardware, firmware, or combination of these. The device or the system is further intended to include or otherwise cover all software or computer programs capable of performing the various heretofore-disclosed determinations, calculations, or the like for the disclosed purposes. For example, exemplary embodiments are intended to cover all software or computer programs capable of enabling processors to implement the disclosed processes. Exemplary embodiments are also intended to cover any and all currently known, related art or later developed non-transitory recording or storage mediums (such as a CD-ROM, DVD-ROM, hard drive, RAM, ROM, floppy disc, magnetic tape cassette, etc.) that record or store such software or computer programs. Exemplary embodiments are further intended to cover such software, computer programs, systems and/or processes provided through any other currently known, related art, or later developed medium (such as transitory mediums, carrier waves, etc.), usable for implementing the exemplary operations disclosed below.

In accordance with the exemplary embodiments, the disclosed computer programs can be executed in many exemplary ways, such as an application that is resident in the memory of a device or as a hosted application that is being executed on a server and communicating with the device application or browser via a number of standard protocols, such as TCP/IP, HTTP, XML, SOAP, REST, JSON and other sufficient protocols. The disclosed computer programs can be written in exemplary programming languages that execute from memory on the device or from a hosted server, such as BASIC, COBOL, C, C++, Java, Pascal, or scripting languages such as JavaScript, Python, Ruby, PHP, Perl, or other suitable programming languages.

Figure 1A:
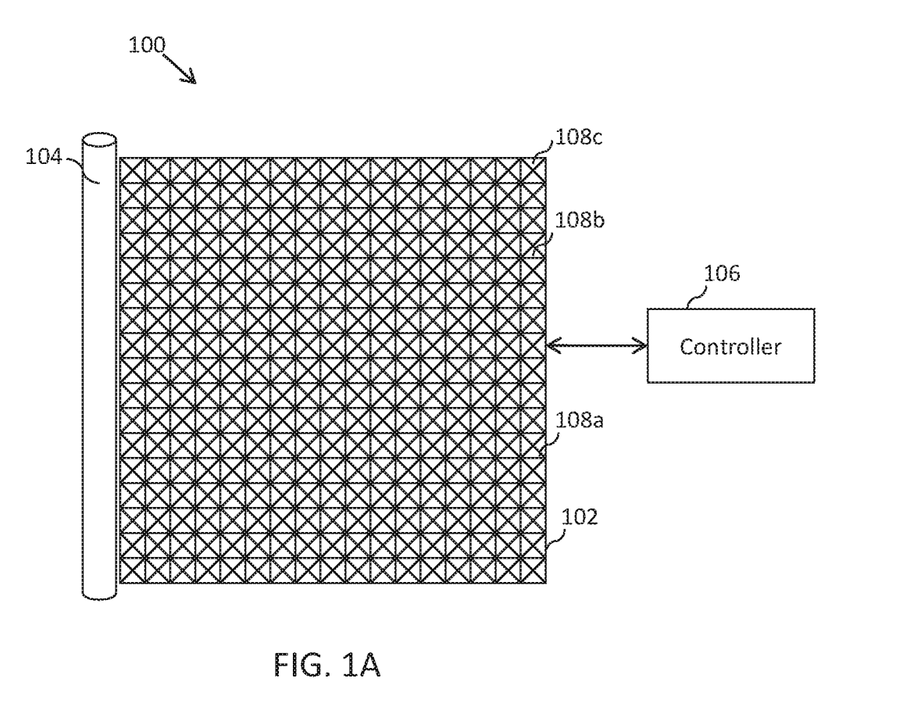
FIG. 1A is a schematic diagram showing a flexible display system in accordance with embodiments of the present subject matter.

The present disclosure is now described in more detail. For example, FIG. 1A illustrates a schematic diagram showing a flexible display system 100 in accordance with embodiments of the present subject matter. Referring to FIG. 1A, the flexible display system 100 includes a flexible display screen 102, a support tube 104 for holding and supporting the flexible display screen 102, and a controller 106 for controlling and operating the flexible display screen 102. Examples of the flexible display screen 102 include, but are not limited to, an electronic paper based display and a flexible OLED display. In embodiments of the present subject matter, the flexible display screen 102 may be rolled over the support tube 104 in a closed position, and unrolled from the support tube 104 in an open position.

The controller 106 may include one or more processors and memory. In an example, the controller 106 may be a microcontroller that contains a processor core, a memory, and programmable input/output peripherals. In an embodiment, the controller 106 may be coupled to a user interface for enabling a user or operator to operate and control the flexible display screen 102.

In embodiments of the present subject matter, the flexible display screen 102 includes an outer display surface and a matrix of inter-connected individual segments 108*a*, 108*b*, and 108*c* (hereinafter collectively referred to as segments 108) layered behind the outer display surface. Each segment 108 may include a case that houses an electromagnet. The cases can be attached to the outer display surface and arranged substantially linearly. Thus, the electromagnets are arranged in a grid-like configuration on a surface of the display 102. The outer display surface may be made of any suitable flexible materials such as, but not limited to, a polymer or other organic material with elasticity properties to allow for the function of a flexible display or e-ink display.

Figure 1B:
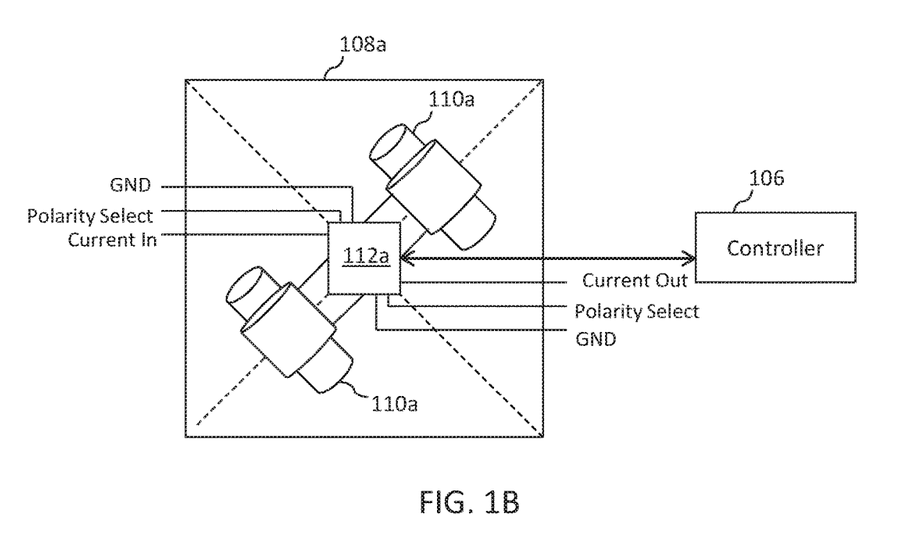
FIG. 1B is a schematic diagram showing an exploded view of an individual segment of the first flexible display system in accordance with embodiments of the present subject matter.

FIG. 1B illustrates a schematic diagram showing an exploded view of the individual segment 108*a* in accordance with embodiments of the present subject matter. The segment 108*a* may include an electromagnet 110*a* and a polarity selection circuit 112*a* connected to the electromagnet 110*a* for setting a polarity of the electromagnet 110*a*. The electromagnet 110*a* includes a core that may be cylindrical, or half torus, or the like.

The polarity of the electromagnet 110*a* can be dynamically adjusted by modifying current flow and input signaling of corresponding polarity selection circuit 112*a*. In an embodiment, the controller 106 is connected to the polarity selection circuit 112*a* for controlling the current flow and polarity of the electromagnet 110*a* based on user selection and/or application executing thereon.

With reference again to FIG. 1A, the controller 106 may be connected to each polarity selection circuit of each individual segment 108, and can be configured to individually actuate each electromagnet by application of electric current to each of the electromagnets. In embodiments of the present disclosure, the controller 106 can be configured to receive from a user, an input signal that indicates a pattern for actuating the electromagnets, and actuate the electromagnets based on the input signal.

In embodiment of the present subject matter, the actuated electromagnets can be used to shape the surface of the display 102 into a predetermined shape. Based on user selection and/or application, the shape of the flexible display 102 can be dynamically modified by adjusting current flow and polarity of electromagnets within the segments 108. The flexible display 102 may automatically curve, wave, or roll up based on actuation of the electromagnets. In an example, some sections of the flexible display 102 may be raised or lowered to create three-dimensional (3D) topographical maps, and raised/depressed lines for tracing, assist the vision impaired with Braille, etc. In other embodiments of the present disclosure, the granularity and resolution of the flexible display 102 may be improved by increasing the total number of segments 108 within. In yet other embodiments, additional electromagnets may be inserted within each segment 108 to create additional variations in magnetic field to affect the shape of the display 102.

Figure 2A:
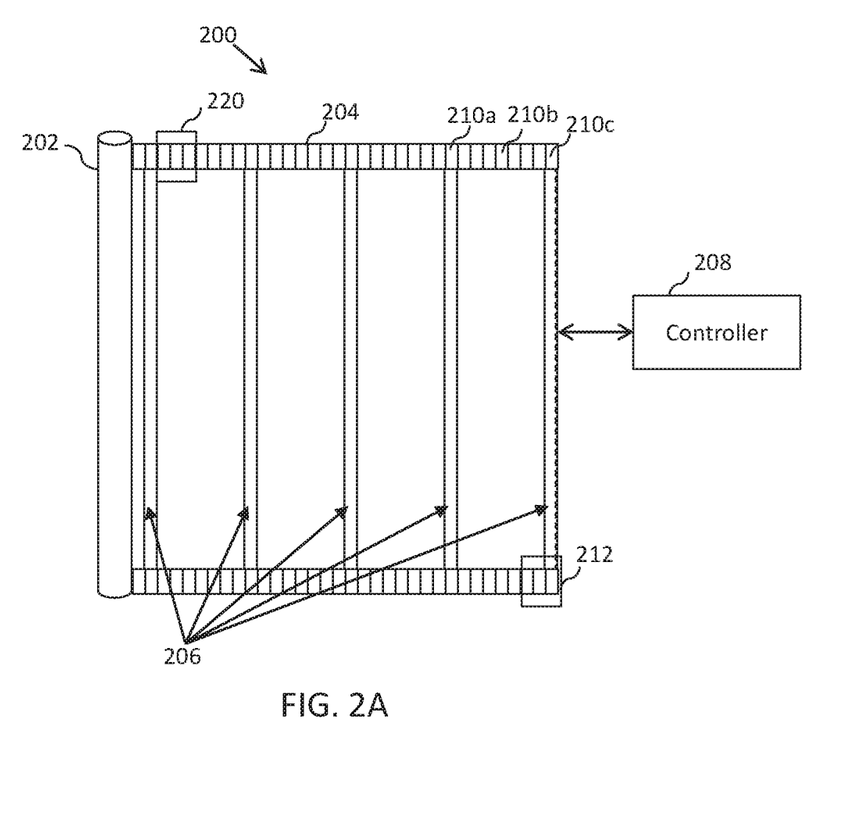
FIG. 2A is a schematic diagram showing a second flexible display system in accordance with embodiments of the present subject matter.

FIG. 2A illustrates a schematic diagram showing a second flexible display system 200 in accordance with an embodiment of the present subject matter. The second flexible display system 200 includes a support tube 202, a flexible display screen 204, support rods 206, and a controller 208 for controlling the flexible display screen 204. In an embodiment, the flexible display screen 204 may be rolled over the support tube 204 in a closed position, and may be unrolled from the support tube 104 in an open position. The support rods 206 are disposed behind the flexible display screen 204 for providing additional support thereof.

The flexible display screen 204 includes multiple segments 210a, 210b and 210c interconnected in a linear arrangement (similar to a watch band), where each segment houses an electromagnet. Thus, the flexible display screen 204 includes multiple electromagnets arranged substantially in two parallel rows positioned along opposing edges thereof.

Figure 2B:
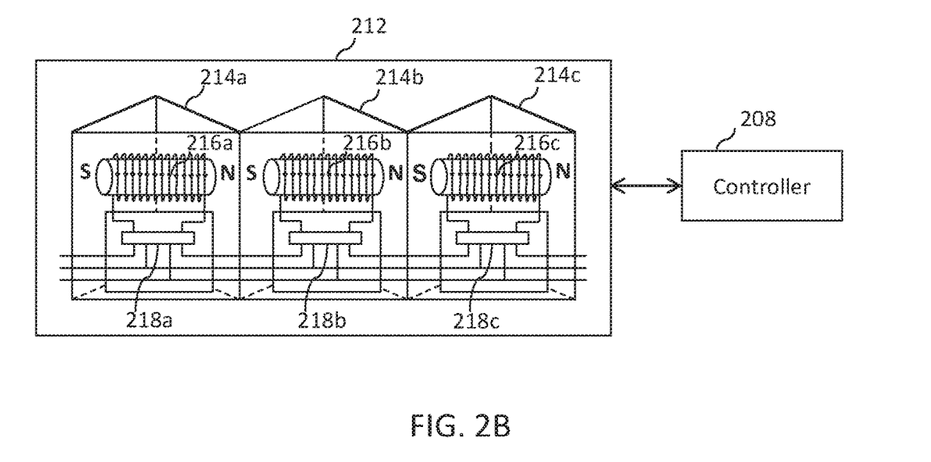
FIG. 2B is a schematic diagram showing an exploded view of a first group of adjacent segments of the second flexible display system in accordance with embodiments of the present subject matter.

FIG. 2B illustrates a schematic diagram showing an exploded view of a first group 212 of first, second and third adjacent segments 214a, 214b and 214c of the flexible display screen 204 in accordance with embodiments of the present subject matter. The first, second and third adjacent segments 214a, 214b and 214c house first, second and third electromagnets 216a, 216b and 216c and first, second and third polarizers 218a, 218b and 218c, respectively. The first, second and third electromagnets 216a, 216b and 216c, either include an iron core or air core based upon the strength of magnetic field required.

In embodiments of the present subject matter, the first, second and third electromagnets 216a, 216b and 216c are positioned in a linear arrangement such that a north pole of the first electromagnet 216a faces a south pole of the second electromagnet 216b, and a north pole of the second electromagnet 216b faces a south pole of the third electromagnet 216c. Further, each of the first, second and third electromagnets 216a, 216b and 216c are configured to produce a magnetic field between respective north and south poles when actuated.

The controller 208 is connected to each of the first, second and third polarizers 218a, 218b and 218c for dynamically adjusting polarity of corresponding electromagnets by modifying current flow and input signaling of the first, second and third polarizers 218a, 218b and 218c. In embodiments, the controller 208 is configured to individually actuate each of the first, second and third electromagnets 216a, 216b and 216c by application of electric current thereto through first, second and third polarizers 218a, 218b and 218c, respectively. The controller 208 is configured to receive from an operator/user, an input signal that indicates a pattern for actuating the electromagnets 216a, 216b and 216c, and actuate the electromagnets 216a, 216b and 216c based on the input signal.

Upon actuation by the controller 208, the magnetic fields generated by the adjacent electromagnets 216a, 216b and 216c cause them to attract one another such that the display 204 is biased to be shaped as the first pre-defined shape. Thus, the actuated electromagnets shape the surface of the display 204 into the first pre-defined shape.

Figure 2C:
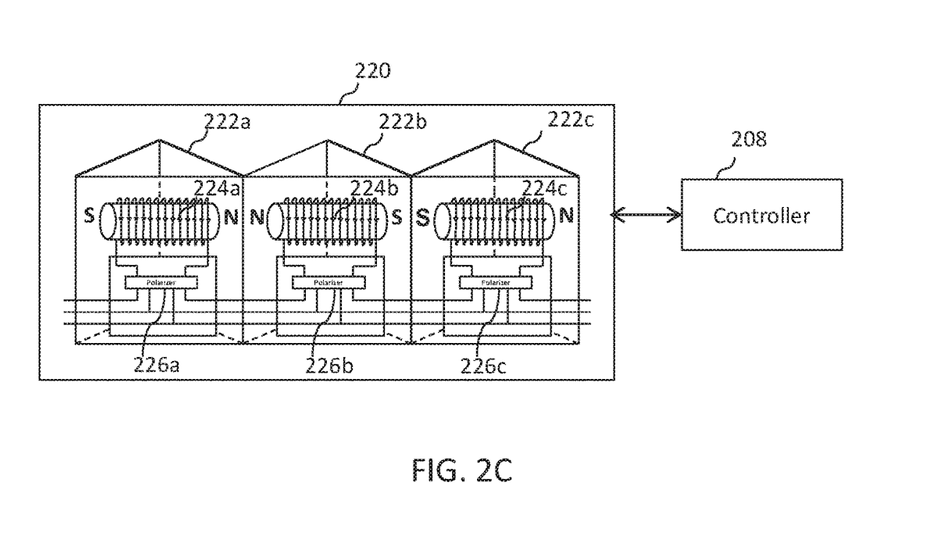
FIG. 2C is a schematic diagram showing an exploded view of a second group of adjacent segments of the second flexible display system in accordance with embodiments of the present subject matter.

FIG. 2C illustrates a schematic diagram showing an exploded view of a second group 220 of fourth, fifth and sixth adjacent segments 222a, 222b and 222c of the flexible display screen 204, in accordance with embodiments of the present subject matter. The fourth, fifth and sixth adjacent segments 222a, 222b and 222c house fourth, fifth and sixth electromagnets 224a, 224b and 224c and fourth, fifth and sixth polarizers 226a, 226b and 226c respectively.

In embodiments of the present subject matter, the fourth, fifth and sixth electromagnets 224a, 224b, and 224c are positioned in a linear arrangement such that a south pole of the fourth electromagnet 224a faces a south pole of the fifth electromagnet 224b and such that a north pole of the fourth electromagnet 224a faces a north pole of the fifth electromagnet 224b, and wherein when actuated by the controller 208, the magnetic fields generated by the fourth and fifth electromagnets 224a and 224b cause them to repel one another such that the display 204 is biased to be shaped as the second pre-defined shape. Thus, the actuated electromagnets 224a, 224b, and 224c shape the surface of the display 204 into the second pre-defined shape. Further, the shape of the flexible screen 204 can be dynamically modified based on user selection and/or application executing therein, by adjusting current flow and polarity of one or more electromagnets contained therein.

Figure 3:
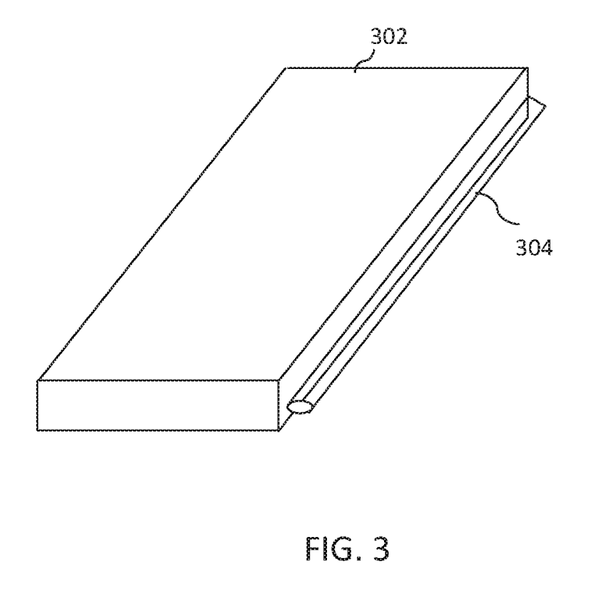
FIG. 3 is a schematic diagram of a communication device and a rolled-up flexible display screen attached to the communication device in accordance with embodiments of the present subject matter.

FIG. 3 illustrates a schematic diagram of a communication device 302 and a rolled-up flexible display screen 304 attached to the communication device 302 in accordance with embodiments of the present subject matter.

Examples of the communication device 302 include, but are not limited to, a tablet computer, a smart phone, an e-reader, a display and a monitor. In embodiments of the present subject matter, the rolled-up flexible display screen 304 may be a pen-shaped device that is configured to wirelessly communicate with the communication device 302 through near-field communication protocols such as used with BLUETOOTH® and WI-FI® wireless communication technologies.

Figure 4:
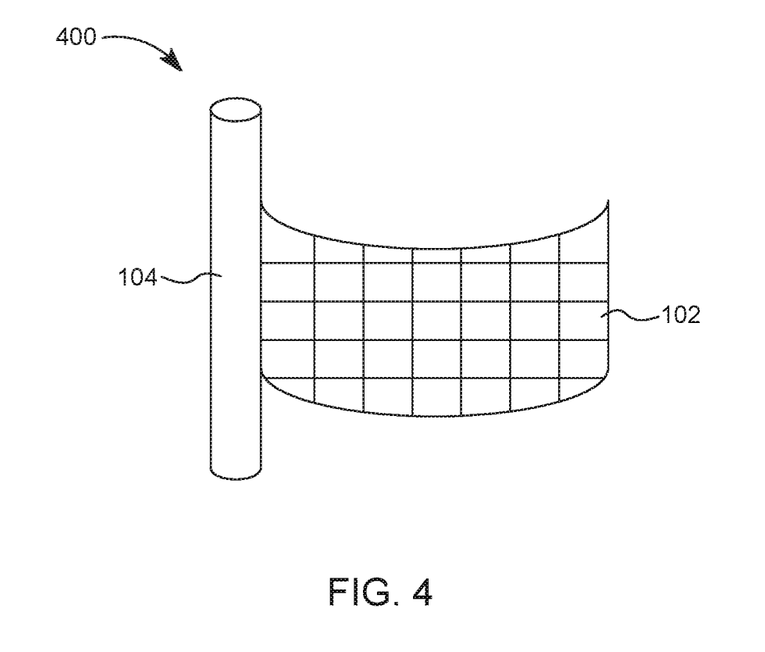
FIG. 4 is a perspective view of a flexible display formed in a depressed line shape in accordance with embodiments of the present subject matter.

FIG. 4 illustrates a perspective view of a flexible display 200 formed in a depressed line shape in accordance with embodiments of the present subject matter. Referring to FIG. 4, the flexible display 200 includes a display 102 and a support tube 104.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A display system comprising:
a display dynamically shaped in one of a first shape and a second shape, the first shape and the second shape being different shapes;
a plurality of electromagnets each comprising a north pole and a south pole, the plurality of electromagnets being positioned in a first linear arrangement and a second linear arrangement,
wherein, at the first linear arrangement, the north pole of at least one of the plurality of electromagnets face an adjacent north pole of at least one of the plurality of electromagnets and the south pole of at least one of the plurality of electromagnets face an adjacent south pole of the at least of the plurality of electromagnets attached to the display,
wherein, at the second linear arrangement, the north pole of at least one of the plurality of electromagnets face an adjacent south pole of the at least one of the plurality of electromagnets;
a first set of polarizers and a second set of polarizers, wherein the first set of polarizers is positioned in the first linear arrangement, and the second set of polarizers is positioned in the second linear arrangement, the first set of polarizers includes at least three polarizers, and the second set of polarizers includes at least three polarizers; and
a controller that connects to the first set of polarizers and the second set of polarizers, individually modifies an electric current flow and input signal at each polarizer of the first set of polarizers for controlling an associated electromagnet among the electromagnets, individually modifies an electric current flow and input signal at each polarizer of the second set of polarizers for controlling an associated electromagnet among the electromagnets, and second polarizers, and actuates each of the plurality of electromagnets by application of the modified electric current flow which repels each of the plurality of electromagnets at the first linear arrangement such that the display is biased to the first shape and attracts each of the plurality of electromagnets at the second linear arrangement such that the display is held in the second shape.

2. The display system of claim 1, wherein the display is a flexible display.

3. The display system of claim 2, wherein the flexible display is one of an electronic paper based display, and a flexible organic light emitting diode (OLED) display.

4. The display system of claim 1, wherein the controller:
receives an input signal; and actuates the electromagnets based on the received input signal.

5. The display system of claim 1, further comprising a plurality of cases that each houses a respective one of the electromagnets.

6. The display system of claim 5, wherein the cases are attached to a surface of the display and arranged substantially linearly.

7. The display system of claim 1, wherein the electromagnets are arranged substantially in two parallel rows on a surface of the display.

8. The display system of claim 7, wherein the two rows are positioned along opposing edges of the display.

9. The display system of claim 1, wherein the controller:
receives an input signal that indicates a pattern; and actuates the electromagnets based on the input signal.

10. The display system of claim 1, wherein the electromagnets are actuated into a predetermined shape.

11. A method comprising:
providing a display system comprising:
a display dynamically shaped in one of a first shape and a second shape, the first shape and the second shape being different shapes;
a plurality of electromagnets each comprising a north pole and a south pole, the plurality of electromagnets being positioned in a first linear arrangement and a second linear arrangement,
wherein, at the first linear arrangement, the north pole of at least one of the plurality of electromagnets face an adjacent north pole of at least one of the plurality of electromagnets and the south pole of at least one of the plurality of electromagnets face an adjacent south pole of the at least of the plurality of electromagnets attached to the display, wherein, at the second linear arrangement, the north pole of at least one of the plurality of electromagnets face an adjacent south pole of the at least one of the plurality of electromagnets;
a first set of polarizers and a second set of polarizers, wherein the first set of polarizers is positioned in the first linear arrangement, and the second set of polarizers is positioned in the second linear arrangement, the first set of polarizers includes at least three polarizers, and the second set of polarizers includes at least three polarizers;
and
connecting to the first set of polarizers and the second set of polarizers;
individually modifying an electric current flow and input signal at each polarizer of the first set of polarizers for controlling as associated electromagnet among the electromagnets,
individually modifying an electric current flow and input signal at each polarizer of the second set of polarizers for controlling an associated electromagnet among the electromagnets;
controlling actuation of the plurality of electromagnets by application of the current flow, which repels each of the plurality of electromagnets at the first linear arrangement such that the display is biased to the first shape and attracts each of the plurality of electromagnets at the second linear arrangement such that the display is held in the second shape.

12. The method of claim 11, wherein the electromagnets are arranged in two substantially parallel rows on a surface of the display.

* * * * *